(12) United States Patent
Hamilton

(10) Patent No.: US 6,879,011 B1
(45) Date of Patent: Apr. 12, 2005

(54) MAGNETICALLY SHIELDED CIRCUIT BOARD

(75) Inventor: Brett J. Hamilton, Heltonville, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 427 days.

(21) Appl. No.: 10/091,529

(22) Filed: Mar. 7, 2002

(51) Int. Cl.[7] .................. H01L 29/82; H01L 43/00; H01L 29/00; H01L 23/52; H01L 23/04
(52) U.S. Cl. ................. 257/421; 257/531; 257/691; 257/698
(58) Field of Search .................. 257/421, 531, 257/691, 698

(56) References Cited

U.S. PATENT DOCUMENTS

| | | | |
|---|---|---|---|
| 4,398,149 A | * | 8/1983 | Zens ................. 324/319 |
| 5,998,867 A | | 12/1999 | Jensen et al. |
| 6,121,672 A | | 9/2000 | Benedetto |
| 6,249,039 B1 | * | 6/2001 | Harvey et al. ......... 257/531 |
| 2004/0070482 A1 | * | 4/2004 | Golan ................ 336/223 |

* cited by examiner

Primary Examiner—Ngân V. Ngô
(74) Attorney, Agent, or Firm—John Tarlano

(57) ABSTRACT

A magnetically shielded circuit board having a conductive solenoid to repel high speed charged particles away from an integrated circuit chip. The conductive solenoid is embedded in the circuit board, or located around the circuit board, or located within an integrated circuit package, the integrated circuit package have been connected to the circuit board. The conductive solenoid is used for conducting an electrical current, the electrical current forming a magnetic field. The magnetic field will repel high speed charged particles away from the integrated circuit chip, the integrated circuit chip being within the integrated circuit package. The circuit board can be used in a space vehicle.

10 Claims, 6 Drawing Sheets

MAGNETICALLY SHIELDED CIRCUIT BOARD

STATEMENT OF GOVERNMENT INTEREST

The invention described herein may be manufactured and used by or for the government of the United States of America for governmental purposes without the payment of any royalties thereon or therefore.

BACKGROUND OF THE INVENTION

In the prior art, the earth has a magnetic field. The magnetic field deflects away charged particles that fly toward the earth. Particularly, the magnetic field deflects away charged particles that fly toward the equator of the earth with maximum deflection of the particles when they are travelling perpendicular to the magnetic field. This natural magnetic field provides a degree of protection from charged particles as they approach the earth's surface.

When a space vehicle travels from the earth's surface, protection from the earth's magnetic field is diminished and the performance characteristics of electronic circuits contained within the space vehicle are at increased risk from degradation caused by charged particles that collide with the space vehicle.

Information relevant to attempts to address this problem can be found in U.S. Pat. No. 5,998,868 (Jensen et al.) and U.S. Pat. No. 6,121,672 (Benedetto). However, each of these references requires a physical shield that adds size and weight to the device to be protected.

U.S. Pat. No. 5,998,868 (Jensen et al.) teaches a Radiation Enhanced Chip Encapsulant for use with space based electronic components. Disclosed is a two part shielding system that includes an inner shield, which is preferably an electrically insulating layer, and an outer shield, which is preferably a loaded encapsulant. In operation, when ionizing radiation is directed at a space based electric component including the encapsulant, the outer layer drains energy from the ionizing radiation and absorbs the same. When the component is subjected to ionizing radiation, secondary electrons, typically from the outer shell, may be emitted. The inner layer traps the secondary electrons before they can act on the encapsulated electronic component. However, Jensen does not suggest a shield, or shield system, that deflects ionized particles away from the device to be shielded.

U.S. Pat. No. 6,121,672 (Benedetto) teaches a Raised Pedestal Radiation Shield for Sensitive Electronics. The radiation shield is attached to the device to be protected and is sized and positioned to extend beyond the outer perimeter of the device, such that the sides of the device are also protected. The shield includes a relatively thick central portion, a relatively thin distal portion and an intermediately sized transitional portion. Preferably, the shield is composed of a high-Z material, such as Kovar or a copper/tungsten alloy. While Benedetto also contemplates attaching a shield to both the top and the bottom of the device to be protected, it does not teach or suggest a shield that surrounds the device, such as a magnetic field.

SUMMARY OF THE INVENTION

The present invention relates to a magnetically shielded circuit board and to a magnetically shielded integrated circuit package for use on a circuit board. A conductive solenoid is used to form a magnetic field either around the circuit board or just around the integrated circuit package. The conductive solenoid is placed either within the circuit board, or around the circuit board, or into the integrated circuit package. Use of one or more conductive solenoids is contemplated by the present invention.

Electrical currents are sent through the conductive solenoids to produce the magnetic fields. The magnetic fields deflect charged particles away from charged-particle-sensitive integrated circuit chips that are on the circuit board.

Magnetically shielded electronic circuits are especially useful in space. Space is a region that has many charged particles that are in flight. Magnetic shielding would be of benefit to a circuit protected with a physical shield by deflecting the secondary electrons produced when high energy particles interact with the shielding.

Again, conductive solenoids are imbedded either into a circuit board, or around a circuit board or into an integrated circuit package. The conductive solenoids are used to conduct currents of electricity. The conductive solenoids thereby produce magnetic fields near the circuit board to deflect charged particles away from charged-particle-sensitive integrated circuit chips.

Charged particles that fly toward the circuit board will not damage integrated circuit chips that are within integrated circuit packages that are connected to the circuit board. The damage prevention to such integrated circuit chips is due to magnetic fields produced near the circuit board.

The circuit board can use superconductive wire solenoids in or around the circuit board, or within integrated circuit packages on the circuit board. When the circuit board, having superconductive wire solenoids, is used in a space vehicle, the superconductive wire solenoids can be made to be superconducting by radiating heat from the superconductive wire solenoids into cold space.

Heat can be transferred from the superconductive wire solenoids to the outside of a space vehicle by means of a heat conductive layer. Then, the superconductive wire solenoids will become superconducting due to a decrease in the amount of heat energy in the superconductive wire solenoids.

Superconductive wire, such as a high temperature superconductive wire, can be used to form superconductive solenoids that are imbedded into or around a circuit board or into an integrated circuit package. An example of a high temperature superconductive wire is a YBa2Cu3O7 superconductive wire.

A conductive solenoid can be formed by wrapping conductive wire around an electrically insulative circuit board layer. The circuit board layer and solenoid can then be made part of a circuit board. Two such circuit board layers and solenoids can be used, to provide two orthogonal conductive solenoids within a circuit board. These layers could be insulated from one another, by another circuit board layer of electrically insulative material. Electrically insulative material could also be placed between the three layers and remainder outer portions of a circuit board. The three layers can thus be incorporated into a circuit board.

A conductive solenoid could be located on or outward of a circuit board. The conductive solenoid could be positioned on or around the circuit board. The conductive solenoid would deflect charged particles, flying toward the circuit board. The charged particles would not hit an integrated circuit that is within an integrated circuit package, the integrated circuit package being attached to the circuit board.

Alternately, a conductive solenoid could be wrapped around an integrated circuit, the conductive solenoid being located within an integrated circuit package that is attached to a circuit board.

DESCRIPTION OF THE PREFERRED EMBODIMENT

Figure 1:
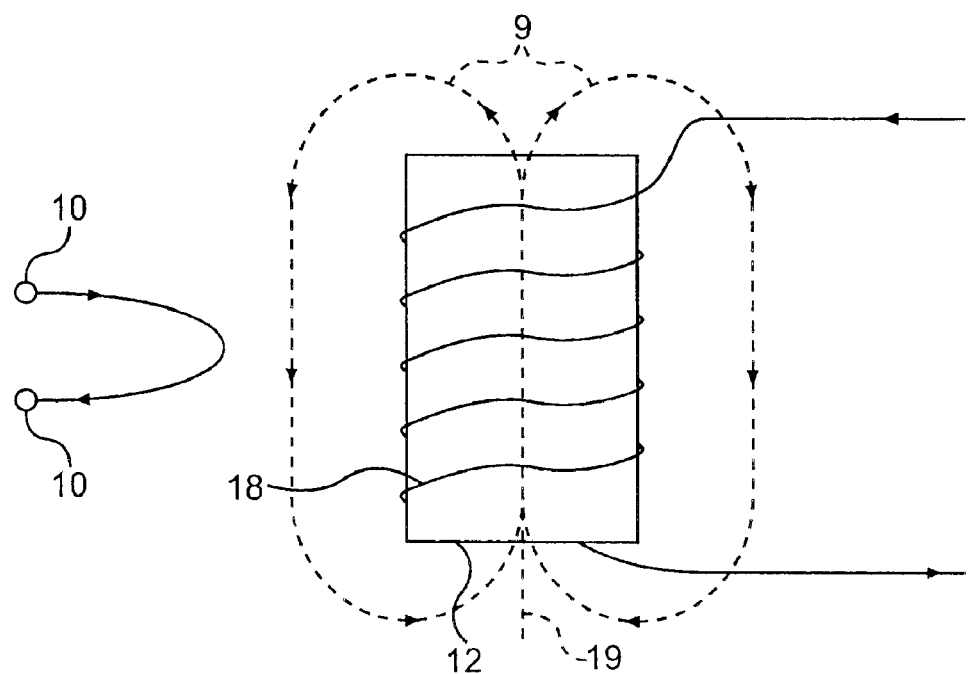
FIG. 1 is a perspective view of a conductive solenoid around a circuit board layer.

FIG. 1 shows an electrically insulative circuit board layer 12 that carries a conductive solenoid 18. The circuit board layer 12 and conductive solenoid 18 can be built into a circuit board, such as a circuit board 6 shown in FIG. 3. Solenoid 18 has a longitudinal axis 19.

As an electrical current is sent through solenoid 18, energy is continuously radiated from solenoid 18. The radiated energy produces a magnetic field 9 shown in FIG. 1. The radiated energy continuously repulses an incoming charged particle 10. Alternately explained, the magnetic field 9 continuously repulses the incoming charged particle 10 that is coming toward solenoid 18 from a direction that is not parallel to longitudinal axis 19.

Figure 2:
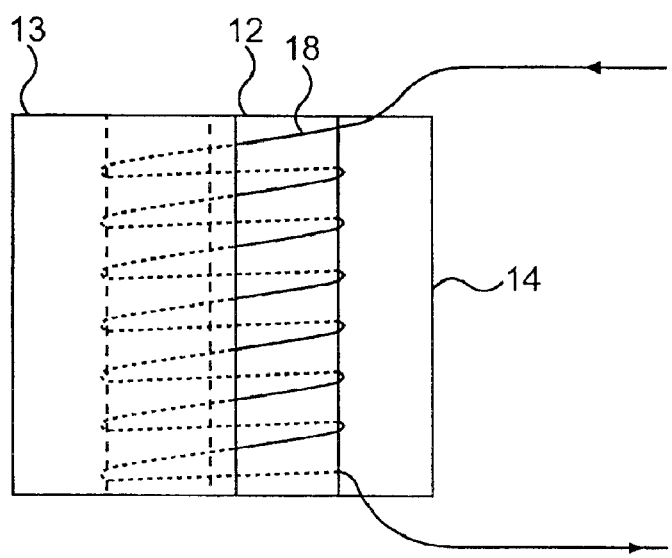
FIG. 2 is an exploded view of three circuit board layers, a conductive solenoid around a central circuit board layer.

In FIG. 2, the conductive solenoid 18 is shown as having been wrapped around a circuit board layer 12. The circuit board layer 12 is a part of a circuit board 6 shown in FIG. 3. Circuit board layer 12 and solenoid 18 are covered by electrically insulative layers 13 and 14. The electrically insulative layers 13 and 14 electrically insulate solenoid 18 from other electrical conductors (not shown) and other circuit board layers of circuit board 6.

The conductive solenoid 18 can be composed of copper wire. The conductive solenoid 18 can also be composed of copper metalization that is formed into a solenoidal shape. Gold or aluminum metalization can be used in place of copper metalization. Further the solenoid 18 can be composed of a superconductive material in the shape of wire or metalization. A superconductive wire can be a high temperature superconductive wire. A representative example of such a high temperature superconductive wire is YBa2Cu3O7 superconductive wire. However, other types of high temperature superconductive wire are known in the art.

Figure 3:
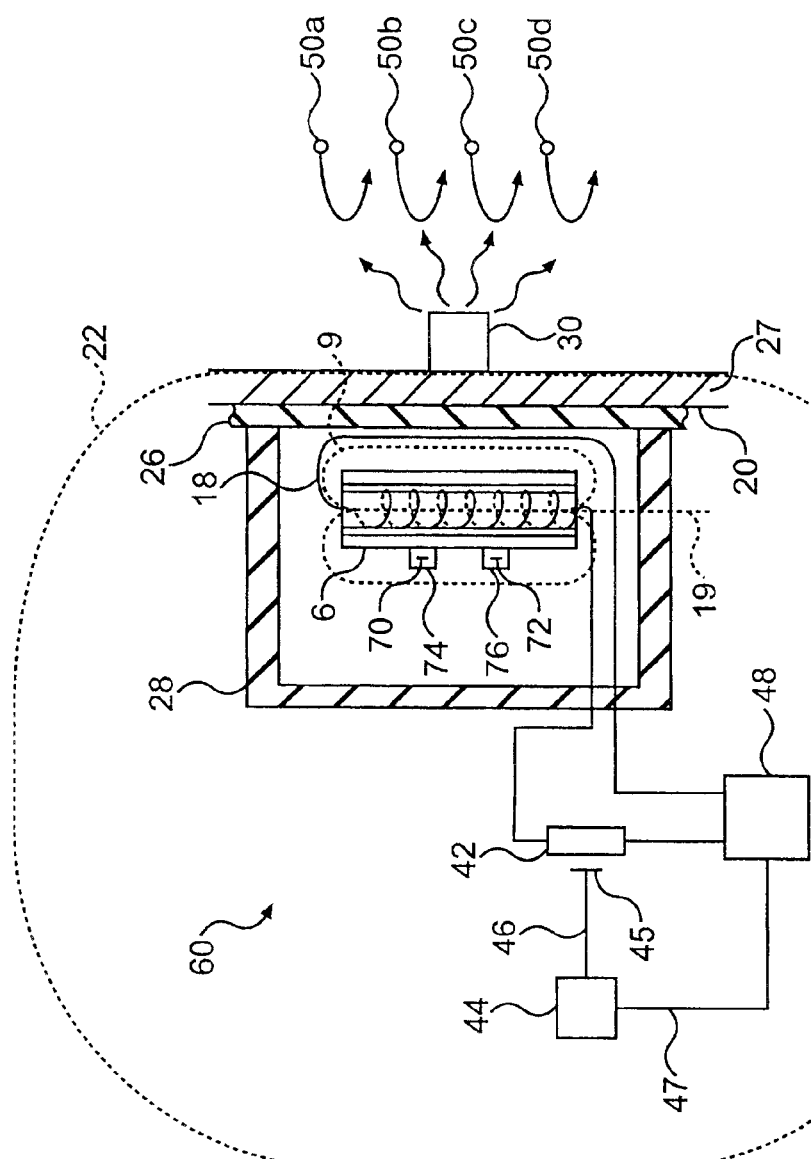
FIG. 3 is a circuit board configuration having a perspective view of a circuit board that has one conductive solenoid within the circuit board, and a block diagram of circuitry to send current through the solenoid, plus a sectional view of a portion of an outer skin of a space vehicle, the space vehicle expressed by means of a phantom line.

FIG. 3 shows a circuit board configuration 60, wherein solenoid 18 is shown within circuit board 6. The solenoid 18 is made by using a high temperature superconductive wire. The superconductive solenoid 18 is located close to an inner surface 20 of a space satellite 22. The superconductive solenoid 18 is in contact with an electrically insulative material 26. The insulative material 26 is located on the outer skin 27 of space satellite 22. The electrically insulative material 26 has a high thermal transfer rate. The outer skin 27 is in contact with a thermal radiator 30. Radiator 30 is outside of space satellite 22. Radiator 30 is on the skin 27 of space satellite 22.

A heat insulative cover 28 encloses circuit board 6. The heat insulative cover 28 prevents heat, that is within space satellite 22, from heating superconductive solenoid 18.

The thermal radiator 30 transfers heat away from superconductive solenoid 18 by radiating the heat into cold space. In this manner, the superconductive solenoid 18 becomes superconducting, when the space satellite 22 is in outer space. Heat is dissipated into space by radiator 30, the heat being removed from the entire length of the superconductive wire of superconductive solenoid 18.

A particle detector 44 is connected to a gate electrode 45 of power transistor switch 42 by means of a line 46. The particle detector 44 is energized, through a line 47, by a power supply 48.

Charged particles, such as charged particles 50a to 50d, might begin to hit the space satellite 22 after the space satellite 22 is in space. The particle detector 44 will detect the presence of the charged particles. The particle detector 44 produces a detector voltage in response to the arrival of the charged particles. The detector voltage closes the power transistor switch 42.

Superconductive solenoid 18 is energized by power supply 48 when switch 42 is closed. The power supply 48 sends a very large current through superconductive solenoid 18, when switch 42 is closed. The current in superconductive solenoid 18 produces magnetic field 9. The magnetic field 9 repulses charged particles, such as charged particle 50a, 50b, 50c and 50d, that travel toward solenoid 18 in a direction that is not parallel to longitudinal axis 19 of solenoid 18. Charged particles 50a, 50b, 50c and 50d are shown as traveling in a direction that is perpendicular to the longitudinal axis 19 of solenoid 18.

In space, the satellite 22 travels around the earth. When high speed charged particles come toward the satellite 22, the switch 42 closes and causes magnetic field 9 to be produced by solenoid 18. The magnetic field 9 exists around circuit board 6. After switch 42 is closed, high-speed charged particles, such as high speed electrons or high speed protons, that come toward the circuit board 6, run up against the magnetic field 9 around the circuit board 6. The charged particles are deflected by magnetic field 9 away from the circuit board 6. The charged particles will not hit integrated circuits 70 and 72 within integrated circuit packages 74 and 76, respectively. The integrated circuit packages 74 and 76 are electrically connected to circuit board 6.

The integrated circuits 70 and 72, in integrated circuit packages 74 and 76 respectively, are protected from high speed electrons. Similarly, high speed protons coming in toward the circuit board 6 will be deflected by the magnetic field 9 that is created by the superconductive solenoid 18, when current passes through superconductive solenoid 18.

Figure 4:
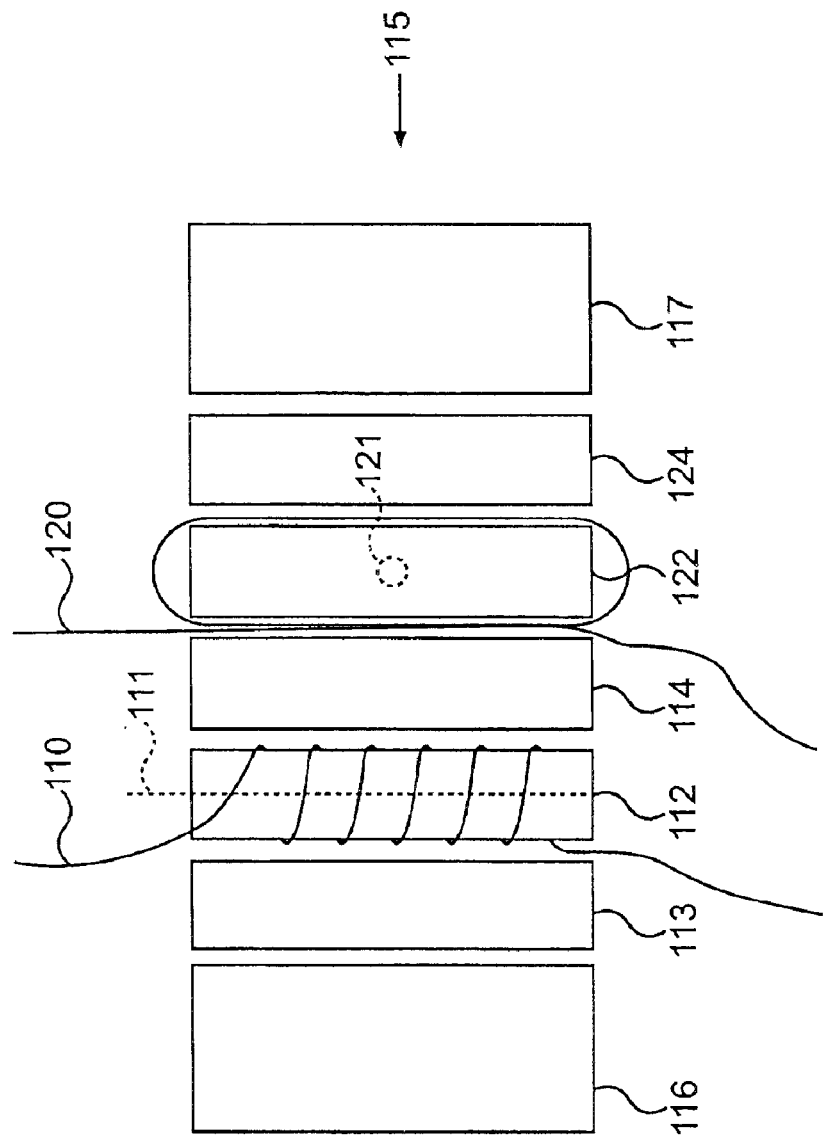
FIG. 4 is an exploded view of a magnetically shielded circuit board having seven layers and having two orthogonal conductive solenoids.

FIG. 4 shows a circuit board 115. The circuit board 115 has two conductive solenoids 110 and 120. Solenoid 110 has a longitudinal axis 111 and solenoid 120 has a longitudinal axis 121. These axes are at right angles to one another, that is, orthogonal to one another.

The circuit board 115 has an electrically insulative layer 112. The conductive solenoid 110 is formed around layer 112. The circuit board 115 also has an electrically insulative layer 122. The conductive solenoid 120 is formed around layer 122. An electrically insulative layer 114 insulates solenoid 110 from solenoid 120. Electrically insulative layer 113 electrically insulates solenoid 112 from a portion 116 of circuit board 115. Electrically insulative layer 124 electrically insulates solenoid 120 from a portion 117 of circuit board 115.

Although not shown in FIG. 4, a single power supply and single switch, such as the power supply 48 and switch 42 shown in FIG. 3, can be attached to each of conductive solenoids 110 and 120 of FIG. 4. The switch can be activated, that is closed, by a particle detector, such as the particle detector 44 of FIG. 3. When the switch is closed, a current would travel through each of solenoids 110 and 120.

Figure 5:
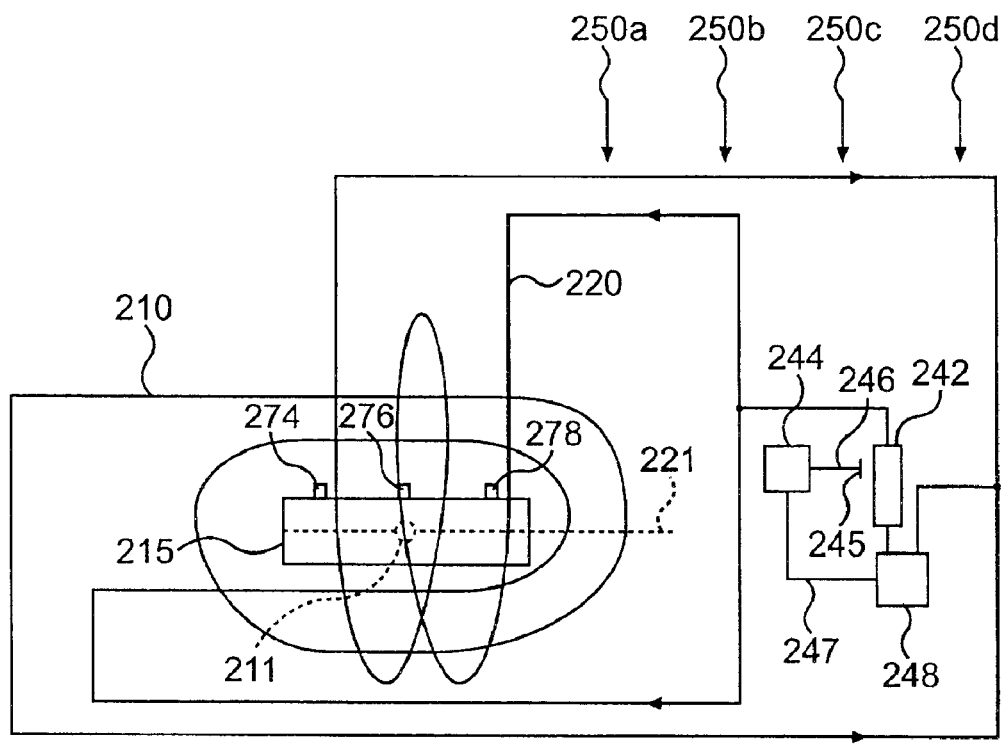
FIG. 5 is a circuit board configuration having a perspective view of a circuit board that has two orthogonal conductive solenoids to the exterior of a circuit board, and a block diagram of circuitry to send current through the solenoids.

In FIG. 5, conductive solenoids 210 and 220 are located around a circuit board 215. The longitudinal axis 211 of solenoid 210 is orthogonal to the longitudinal axis 221 of solenoid 220. When a current is sent through each of solenoids 210 and 220, solenoids 210 and 220 will deflect away charged particles that fly toward the circuit board 215 in any direction.

The solenoids 210 and 220 are energized by a power supply 248, due to closing of a switch 242. The switch 242 is closed due to the arrival of charged particles, and a sensing of the charged particles by particle detector 244.

The particle detector 244 is connected to a gate electrode 245 of power transistor switch 242 by means of a line 246. The particle detector 244 is energized through a line 247 by a power supply 248.

When charged particles, such as charged particles 250a, 250b, 250c and 250d, arrive, the particle detector 244 detects their presence. The particle detector 244 produces a detector voltage in response to the arrival of these charged particles. The detector voltage activates, that is closes, the power transistor switch 242.

Conductive solenoids 210 and 220 are energized by power supply 248 when switch 242 is closed. The power supply 248 sends a current through conductive solenoids 210 and 220, when switch 242 is closed. The current in each of conductive solenoids 210 and 220 produces a magnetic field, as described in relation to FIG. 1. The two magnetic fields repulse charged particles, such as charged particles 250a, 250b, 250c and 250d, that travel in any direction toward circuit board 215. Charged particles 250a, 250b, 250c and 250d are shown as traveling in a direction that is perpendicular to the longitudinal axes 211 and 221 of solenoids 210 and 220.

The circuit board configuration 260 of FIG. 5 could be placed in a space satellite that travels around the earth. When high speed charged particles come toward the satellite, the switch 242 closes and causes magnetic fields to be produced by solenoids 210 and 220. The two magnetic fields exist around circuit board 215. After switch 242 is closed, high-speed charged particles, such as charged particles 250a to 250d, and including high speed electrons or high speed protons, that come toward the circuit board 215, run up against the two magnetic fields around the circuit board 215. These charged particles are deflected by the magnetic fields away from the circuit board 215. The charged particles will not hit an integrated circuit within any of integrated circuit packages 274, 276 and 278. The integrated circuit packages 274, 276 and 278 are electrically connected to circuit board 215.

The integrated circuits in integrated circuit packages 274, 276 and 278 are protected from high speed electrons. Similarly, high speed protons coming in toward the circuit board 215 will be deflected by the magnetic fields that are created by the conductive solenoids 210 and 220.

Figure 6:
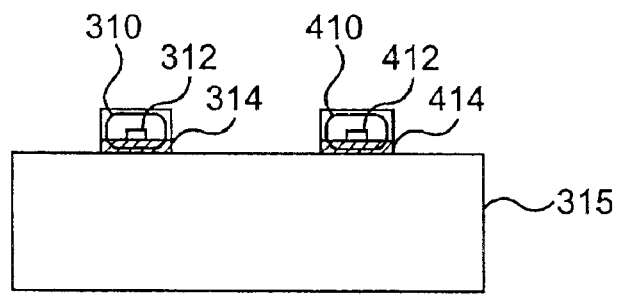
FIG. 6 is a sectional view of two magnetically shielded integrated circuit packages on a circuit board.

In FIG. 6, a conductive solenoid 310 is wrapped around the integrated circuit 312. The solenoid 310 is located within integrated circuit package 314. Similarly, a conductive solenoid 410 is wrapped around an integrated circuit 412. The solenoid 410 is located within integrated circuit package 414. Integrated circuit packages 314 and 414 are connected to circuit board 315 of FIG. 6. Current can be sent through solenoids 310 and 410 to protect integrated circuits 312 and 412 from high speed charged particles, as described above.

Figure 7:
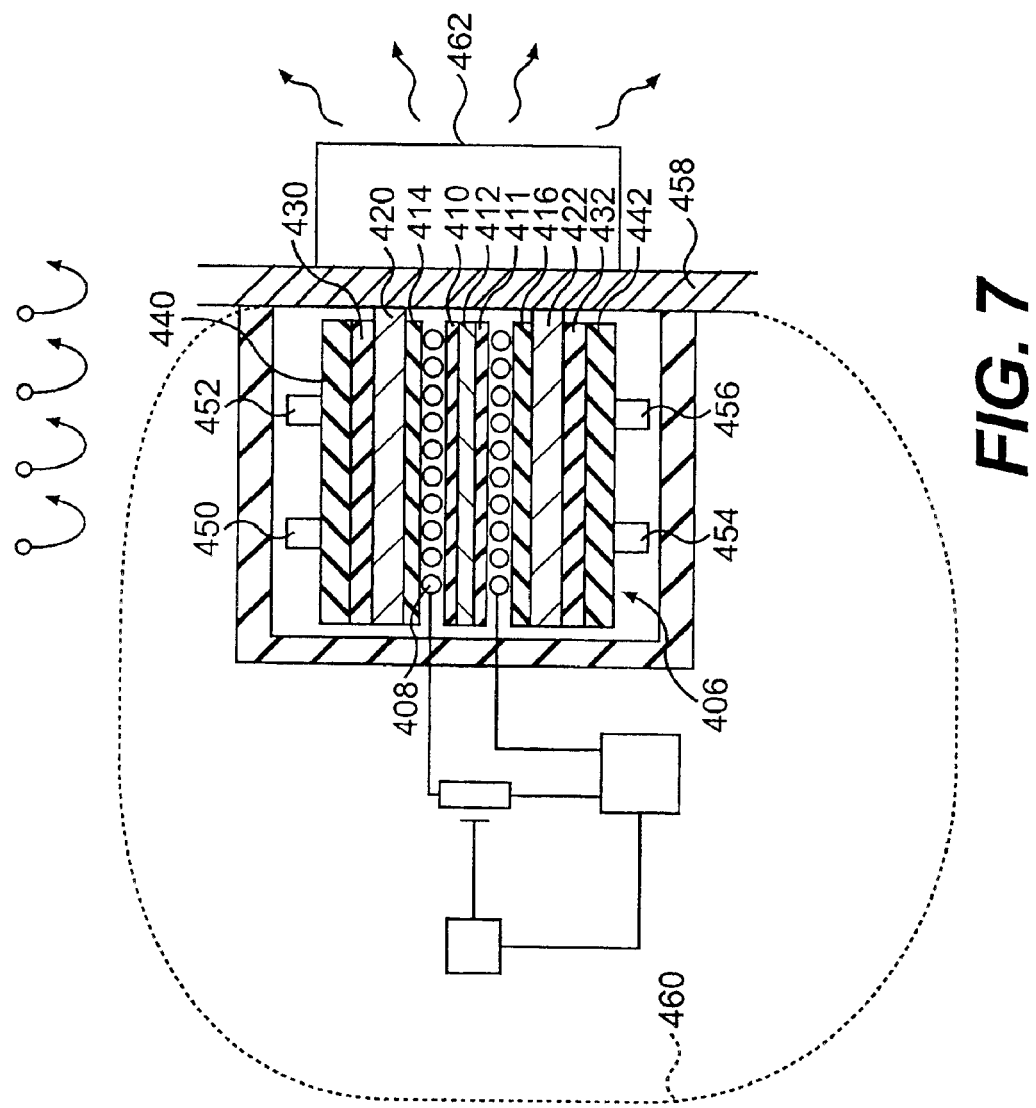
FIG. 7 is a circuit board configuration having a sectional view of a circuit board that has one conductive solenoid within the circuit board, and a block diagram of circuitry to send current through the solenoid, plus a sectional view of a portion of an outer skin of a space vehicle, the space vehicle expressed by means of a phantom line.

In FIG. 7, a circuit board 406 includes a superconductive solenoid 408. The superconductive solenoid 408 is made from a high temperature superconductive wire. The super conductive solenoid 408 is insulated by electrically insulative layers 410 and 411 from a highly ferromagnetic sheet 412. Insulative layers 414 and 416 electrically insulate solenoid 408 from highly thermal conducting, non-ferromagnetic plates 420 and 422. Insulative layers 414 and 416 each have a high thermal transfer rate. Highly heat conductive plates 420 and 422, such as silver plates, are located on the outer sides of the insulative layers 414 and 416. Insulative layers 430 and 432 are respectively located on metal plates 420 and 422. Layers 440 and 442 of circuit board 406 are respectively located on insulative layers 430 and 432.

Integrated circuit packages 450, 452, 454 and 456 are connected to the circuit board 406.

The metal plates 420 and 422 are connected to the skin 458 of a space vehicle 460. A heat radiator 462 is located on the outer surface of skin 458, and opposite the circuit board 406. Heat is carried away from solenoid 408 by the metal plates 420 and 422. The solenoid 408 becomes superconducting when the space vehicle 460 is in space.

Figure 8:
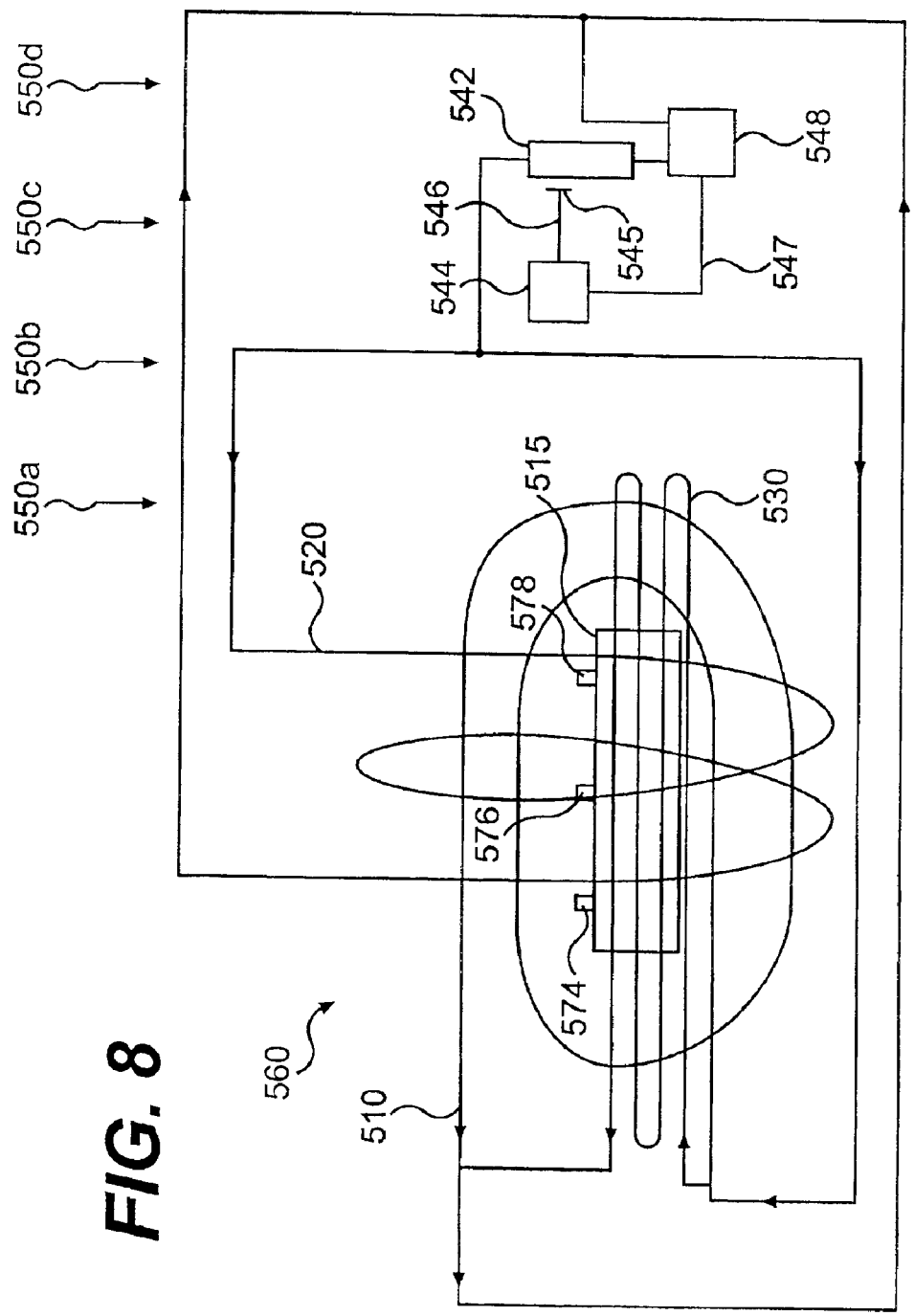
FIG. 8 is a circuit board configuration having a perspective view of a circuit board that has three orthogonal conductive solenoids to the exterior of a circuit board, and a block diagram of circuitry to send current through the solenoids.

In FIG. 8, conductive solenoids 510, 520 and 530 are located around a circuit board 515. The longitudinal axes of solenoids 510, 520 and 530 are orthogonal to each other. When a current is sent through each of solenoids 510, 520 and 530, solenoids 510, 520 and 530 will deflect away charged particles that fly toward the circuit board 515 from any direction. The solenoids 510, 520 and 530 are energized by a power supply 548, due to closing of a switch 542. The switch 542 is closed due to the arrival of charged particles and a sensing of the arrival of charged particles by particle detector 544.

The particle detector 544 is connected to a gate electrode 545 of power transistor switch 542 by means of a line 546. The particle detector 544 is energized through a line 547 by a power supply 548.

When charged particles, such as charged particles 550a, 550b, 5250c and 550d, arrive, the particle detector 544 detects their presence. The particle detector 544 produces a detector voltage in response to the arrival of these charged particles. The detector voltage activates, that is closes, the power transistor switch 542.

Conductive solenoids 510, 520 and 530 are energized by power supply 548 when switch 542 is closed. The power supply 548 sends a current through conductive solenoids 510, 520 and 530, when switch 542 is closed. The current in conductive solenoids 510, 520 and 530 produces three magnetic fields. The three magnetic fields repulse charged particles, such as charged particles 550a, 550b, 550c and 550d, that travel from any direction toward circuit board 515.

In space, a satellite that has a circuit board configuration 560 of FIG. 8, could travel around the earth. When high speed charged particles come toward the satellite, the switch 542 closes and causes magnetic fields to be produced by solenoids 510, 520 and 530. The magnetic fields exist around circuit board 515. After switch 542 is closed, high-speed charged particles, such as high speed electrons or high speed protons, that come toward the circuit board 515, run up against the magnetic fields around the circuit board 515. The charged particles are deflected by the magnetic fields away from the circuit board 515. The charged particles will not hit an integrated circuit respectively within each of integrated circuit packages 574, 576 and 578. The integrated circuit packages are electrically connected to circuit board 515.

Thus the integrated circuits in integrated circuit packages 574, 576, and 578 are protected from high speed electrons. Similarly high speed protons coming in toward the circuit board 515 will be deflected by the three magnetic fields that are created by the conductive solenoids 510, 520 and 530.

While the present invention has been disclosed in connection with the preferred embodiment thereof, it should be understood that there are other embodiments that fall within the spirit and scope of the invention as defined by the following claims.

What is claimed is:

1. A magnetically shielded circuit board, comprising:
    (a) a circuit board;
    (b) a conductive solenoid, the conductive solenoid being imbedded within the circuit board;
    (c) a particle detector for detecting arrival of charged particles at the circuit board; and
    (d) a power supply for sending an electrical current through the the conductive solenoid, when the particle detector detects the arrival of charged particles, to deflect later arriving charged particles away from the circuit board.

2. The magnetically shielded circuit board of claim 1 and further comprising an integrated circuit package, the integrated circuit package being located on the magnetically shielded circuit board.

3. A magnetically shielded circuit board, comprising:
    (a) a circuit board;
    (b) a conductive solenoid, the conductive solenoid being located around the circuit board;
    (c) a particle detector for detecting arrival of charged particles at the circuit board;
    (d) a power supply for sending an electrical current through the conductive solenoid, when the particle detector detects the arrival of charged particles, to deflect later arriving charged particles away from the circuit board.

4. A magnetically shielded circuit board, comprising:
    a circuit board, a first conductive solenoid having a first axis, the first conductive solenoid being around a first electrically insulative circuit board layer, the first electrically insulative circuit board layer and first conductive solenoid being imbedded in the circuit board, and a second conductive solenoid having a second axis, the second conductive solenoid being around a second electrically insulative circuit board layer, the second electrically insulative circuit board layer and second conductive solenoid being imbedded in the circuit board, the second axis being perpendicular to the first axis.

5. The magnetically shielded circuit board of claim 1 wherein the wherein the conductive solenoid is a superconductive solenoid.

6. A circuit board configuration comprising the magnetically shielded circuit board of claim 5 and a space vehicle, the magnetically shielded circuit board being connected to a skin of the space vehicle, heat from the superconductive wire solenoid being conducted through the space vehicle to the exterior of the space vehicle, when the space vehicle is traveling in space.

7. The circuit board configuration of claim 6 and further comprising a thermal radiator connected to the exterior of the space vehicle, the thermal radiation being able to radiate heat energy into space, the superconductive wire solenoid in thermal contact with the thermal radiator.

8. A magnetically shielded integrated circuit package, comprising:
    (a) an integrated circuit package;
    (b) an integrated circuit chip, the integrated circuit chip located within the integrated circuit package;
    (c) a conductive solenoid, the conductive solenoid located around the integrated circuit chip, the conductive solenoid being located within the integrated circuit package
    (d) a particle detector for detecting arrival of charged particles at the integrated circuit package; and
    (e) a power supply for sending an electrical current through the conductive solenoid, when the particle detector detects the arrival of charged particles, to deflect later arriving charged particles away from the integrated circuit chip.

9. Apparatus for deflecting charged particles away from a circuit board, comprising:
    (a) two conductive solenoids around the circuit board, each conductive solenoid having a longitudinal axis, the longitudinal axis of one of the two conductive solenoids forming a right angle with the longitudinal axis of the other of the two conductive solenoids;
    (b) a particle detector for detecting arrival of charged particles at the circuit board; and
    (c) a power supply for sending an electrical current through the two conductive solenoids, when the particle detector detects the arrival of charged particles, to deflect later arriving charged particles away from the circuit board.

10. Apparatus for deflecting charged particles away from a circuit board, comprising:
    (a) three solenoids around the circuit board, each of the three solenoids having a longitudinal axis, a longitudinal axis of one of the three solenoids forming a right angle with a longitudinal axis of each of other two solenoids;
    (b) a particle detector for detecting arrival of charged particles at the circuit board; and
    (c) a power supply for sending an electrical current through the three solenoids, when the particle detector detects the arrival of charged particles, to deflect later arriving charged particles away from the circuit board.

* * * * *